United States Patent
Kuan et al.

(10) Patent No.: US 10,347,616 B2
(45) Date of Patent: Jul. 9, 2019

(54) CHIP PACKAGE AND MANUFACTURING METHOD THEREOF

(71) Applicant: XINTEC INC., Taoyuan (TW)

(72) Inventors: Hsin Kuan, Zhubei (TW); Chin-Ching Huang, Zhudong Township (TW); Chia-Ming Cheng, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/590,302

(22) Filed: May 9, 2017

(65) Prior Publication Data

US 2017/0330871 A1    Nov. 16, 2017

Related U.S. Application Data

(60) Provisional application No. 62/336,454, filed on May 13, 2016.

(51) Int. Cl.
*H01L 25/16* (2006.01)
*H01L 31/0203* (2014.01)
(Continued)

(52) U.S. Cl.
CPC ........ *H01L 25/167* (2013.01); *H01L 23/5389* (2013.01); *H01L 24/19* (2013.01); *H01L 27/14618* (2013.01); *H01L 31/0203* (2013.01); *H01L 2224/04105* (2013.01); *H01L 2224/12105* (2013.01); *H01L 2224/24137* (2013.01);
(Continued)

(58) Field of Classification Search
CPC . H01L 2224/13137; H01L 2224/24137; H01L 2224/03; H01L 2224/03001; H01L 2224/03002; H01L 2224/10; H01L 2224/11; H01L 2224/11001; H01L 2224/11002; H01L 2224/16153; H01L 31/02327; H01L 31/08–31/09; H01L 31/112–31/1136; H01L 31/1123; H01L 31/12–31/173; H01L 31/1892
See application file for complete search history.

(56) References Cited

U.S. PATENT DOCUMENTS

| | | | | |
|---|---|---|---|---|
| 6,064,555 A | * | 5/2000 | Czajkowski | H01L 23/552 257/E23.114 |
| 8,623,689 B2 | * | 1/2014 | Chang | H01L 27/14618 438/67 |

(Continued)

FOREIGN PATENT DOCUMENTS

| TW | 201123321 | 7/2011 |
|---|---|---|
| TW | 201409659 | 3/2014 |
| TW | 201541617 | 11/2015 |

*Primary Examiner* — Maliheh Malek
(74) *Attorney, Agent, or Firm* — Liu & Liu

(57) ABSTRACT

A chip package includes a sensing chip, a computing chip, and a protective layer annularly surrounding the sensing chip and the computing chip. The sensing chip has a first conductive pad, a sensing element, a first surface and a second surface opposite to each other. And the sensing element is disposed on the first surface. The computing chip has a second conductive pad and a computing element. The protective layer is formed by lamination and at least exposes the sensing element. The chip package further includes a conductive layer underneath the second surface of the sensing chip and extending to be in contact with the first conductive pad and the second conductive pad.

7 Claims, 11 Drawing Sheets

(51) Int. Cl.
*H01L 23/538* (2006.01)
*H01L 23/00* (2006.01)
*H01L 27/146* (2006.01)
*H01L 23/051* (2006.01)

(52) U.S. Cl.
CPC *H01L 2224/73267* (2013.01); *H01L 2924/14* (2013.01); *H01L 2924/141* (2013.01); *H01L 2924/143* (2013.01); *H01L 2924/1461* (2013.01); *H01L 2924/18162* (2013.01); *H01L 2924/37001* (2013.01)

(56) References Cited

U.S. PATENT DOCUMENTS

| | | | | |
|---|---|---|---|---|
| 9,818,722 | B1* | 11/2017 | Wang | H01L 25/0652 |
| 2002/0157475 | A1* | 10/2002 | Onose | G01L 9/0042 |
| | | | | 73/754 |
| 2005/0269483 | A1* | 12/2005 | Kohno | H04N 5/335 |
| | | | | 250/208.1 |
| 2006/0001147 | A1* | 1/2006 | Tomita | H01L 27/14618 |
| | | | | 257/690 |
| 2006/0040421 | A1* | 2/2006 | Farnworth | H01L 27/14618 |
| | | | | 438/106 |
| 2008/0012084 | A1* | 1/2008 | Kwon | H01L 27/14618 |
| | | | | 257/432 |
| 2008/0290438 | A1* | 11/2008 | Weng | H01L 27/14618 |
| | | | | 257/434 |
| 2009/0050995 | A1* | 2/2009 | Liu | H01L 23/3114 |
| | | | | 257/434 |
| 2009/0256260 | A1* | 10/2009 | Nakamura | H01L 27/14618 |
| | | | | 257/758 |
| 2010/0090304 | A1* | 4/2010 | Liu | H01L 21/76898 |
| | | | | 257/432 |
| 2011/0079892 | A1* | 4/2011 | Tsai | H01L 23/552 |
| | | | | 257/700 |
| 2012/0115262 | A1* | 5/2012 | Menard | H01L 21/6835 |
| | | | | 438/26 |
| 2013/0099387 | A1* | 4/2013 | Caskey | H01L 24/06 |
| | | | | 257/774 |
| 2013/0119556 | A1* | 5/2013 | Liu | H01L 23/585 |
| | | | | 257/774 |
| 2013/0153933 | A1* | 6/2013 | Lee | H01L 31/12 |
| | | | | 257/82 |
| 2013/0214375 | A1* | 8/2013 | Dai | H01L 27/14618 |
| | | | | 257/459 |
| 2013/0221470 | A1* | 8/2013 | Kinsman | H01L 27/14618 |
| | | | | 257/434 |
| 2014/0027872 | A1* | 1/2014 | Yu | H01L 21/76898 |
| | | | | 257/432 |
| 2014/0061839 | A1* | 3/2014 | Ting | H01L 27/14636 |
| | | | | 257/435 |
| 2014/0116122 | A1* | 5/2014 | Lammel | G01L 19/0092 |
| | | | | 73/73 |
| 2014/0264719 | A1* | 9/2014 | Chou | H01L 21/76229 |
| | | | | 257/506 |
| 2014/0361387 | A1* | 12/2014 | Meyer | H01L 24/19 |
| | | | | 257/415 |
| 2015/0061137 | A1* | 3/2015 | Lee | H01L 23/48 |
| | | | | 257/758 |
| 2015/0097286 | A1* | 4/2015 | Suen | H01L 22/12 |
| | | | | 257/737 |
| 2015/0255499 | A1* | 9/2015 | Lee | H01L 27/14605 |
| | | | | 257/432 |
| 2015/0262984 | A1* | 9/2015 | Krabe | H01L 25/167 |
| | | | | 257/82 |
| 2015/0270243 | A1* | 9/2015 | Yang | H01L 24/32 |
| | | | | 438/118 |
| 2016/0163755 | A1* | 6/2016 | Huang | H01L 27/14636 |
| | | | | 257/459 |
| 2016/0182886 | A1* | 6/2016 | Lin | H01L 27/14618 |
| | | | | 348/46 |
| 2016/0197113 | A1* | 7/2016 | Wong | H01L 27/14636 |
| | | | | 257/432 |
| 2016/0218063 | A1* | 7/2016 | Tsai | H01L 24/20 |
| 2016/0218082 | A1* | 7/2016 | Lee | H01L 24/19 |
| 2016/0276277 | A1* | 9/2016 | Syu | H01L 23/53228 |
| 2016/0293581 | A1* | 10/2016 | Lin | H01L 23/3157 |
| 2016/0351608 | A1* | 12/2016 | Huang | H01L 27/14623 |
| 2016/0355393 | A1* | 12/2016 | Liu | B81B 3/0081 |
| 2017/0025370 | A1* | 1/2017 | Chen | H01L 24/06 |
| 2017/0052277 | A1* | 2/2017 | Wong | G01V 8/12 |
| 2017/0077158 | A1* | 3/2017 | Huang | H01L 27/14623 |
| 2017/0092594 | A1* | 3/2017 | Song | H01L 23/552 |
| 2017/0092607 | A1* | 3/2017 | Kuan | H01L 21/78 |
| 2017/0098678 | A1* | 4/2017 | Lai | H01L 27/1462 |
| 2017/0125346 | A1* | 5/2017 | Liu | H01L 21/762 |
| 2017/0148844 | A1* | 5/2017 | Ho | H01L 27/14618 |
| 2017/0186712 | A1* | 6/2017 | Shen | H01L 21/76898 |
| 2017/0207170 | A1* | 7/2017 | Nair | H01L 23/5389 |
| 2017/0213864 | A1* | 7/2017 | Chen | H01L 23/544 |
| 2017/0213865 | A1* | 7/2017 | Yiu | H01L 27/1462 |
| 2017/0256496 | A1* | 9/2017 | Lin | H01L 21/4853 |
| 2017/0284951 | A1* | 10/2017 | Pindl | H01L 21/2007 |
| 2017/0287738 | A1* | 10/2017 | Tsai | H01L 24/20 |
| 2017/0301649 | A1* | 10/2017 | Wu | H01L 24/32 |
| 2017/0309496 | A1* | 10/2017 | Nakajima | H01L 24/24 |
| 2017/0317029 | A1* | 11/2017 | Hsieh | H01L 23/5386 |
| 2018/0012853 | A1* | 1/2018 | Lin | H01L 24/82 |
| 2018/0102321 | A1* | 4/2018 | Ho | H01L 27/14618 |
| 2018/0114804 | A1* | 4/2018 | Hsieh | H01L 27/14643 |
| 2018/0175101 | A1* | 6/2018 | Ho | H01L 27/14687 |
| 2018/0181788 | A1* | 6/2018 | Chen | G06K 9/00053 |

* cited by examiner

CHIP PACKAGE AND MANUFACTURING METHOD THEREOF

CROSS-REFERENCE TO RELATED APPLICATION

This application claims priority to U.S. Provisional Application Ser. No. 62/336,454, filed May 13, 2016, which is herein incorporated by reference.

BACKGROUND

As the demand for electrical or optoelectronic products, such as digital cameras, digital video recorders, mobile phones, solar cells, screens and lighting equipment, increases, the progress of semiconductor technology is quite fast. The size of a semiconductor chip has a tendency to be miniaturized, and the function has become more complex.

In the structure of the optoelectronic products mentioned above, the light sensing element plays an important role in the application of image capturing. These optoelectronic elements are individually packaged so as to form chip packages, and then are electrically connected to other chip packages having computing elements or controlling elements by external conductive structures, thereby forming a complete semiconductor device. However, the method mentioned above would increase the difficulty of semiconductor packaging and decrease the yield. Accordingly, it is necessary to find a new package structure and packaging method to solve the issue mentioned above.

FIELD OF INVENTION

The present invention relates to a chip package and a manufacturing method thereof.

SUMMARY

In order to solve the problem mentioned above, the present disclosure provides a chip package and a manufacturing method thereof which may package a sensing chip and a computing chip in the same chip package. In addition, the leakage current may be decreased and the protective effect may be enhanced during reliability tests by a protective layer which is formed annularly surrounding the sensing chip and the computing chip, according the novel manufacturing method of the present disclosure.

One of the aspects of the present disclosure provides a chip package. The chip package includes a sensing chip, a computing chip, a protective layer, and a conductive layer. The sensing chip includes a first conductive pad, a sensing element, a first surface and a second surface opposite to the first surface, and the sensing element is disposed under the first surface and electrically connected to the first conductive pad. The computing chip includes a second conductive pad and a computing element. The protective layer annularly surrounds the sensing chip and the computing chip and exposes the sensing element of the sensing chip. The conductive layer is disposed on the second surface of the sensing chip, and the conductive layer is extended to and in contact with the first conductive pad and the second conductive pad.

In accordance with some embodiments of the present disclosure, the chip package further includes a transparent substrate disposed under the first surface of the sensing chip and electrically connected to the sensing chip and the computing chip.

In accordance with some embodiments of the present disclosure, the sensing chip is connected to the transparent substrate through a dam structure.

In accordance with some embodiments of the present disclosure, the computing chip is connected to the transparent substrate through a second dam structure.

In accordance with some embodiments of the present disclosure, the computing chip is connected to the transparent substrate through a flat plate structure.

In accordance with some embodiments of the present disclosure, the chip package further includes an insulation layer between the sensing chip and the conductive layer and between the computing chip and the conductive layer.

In accordance with some embodiments of the present disclosure, the chip package further includes an external conductive connection disposed on the conductive layer and electrically connected to the conductive layer.

One of the aspects of the present disclosure provides a method for manufacturing a chip package. The method first provides a chip which has a conductive pad, a first surface and a second surface opposite to the first surface. Then, a protective layer is laminated on the second surface of the chip and the protective layer annularly surrounds the chip. A part of the protective layer is removed to expose at least a part of the first surface, a part of the second surface or a combination thereof. Then, a conductive layer is formed on the second surface of the chip, the conductive layer extending to and in contact with the conductive pad.

In accordance with some embodiments of the present disclosure, the chip includes a plurality of the chips.

In accordance with some embodiments of the present disclosure, at least a part of the chips is a sensing chip having a sensing element disposed under the first surface of the chip.

In accordance with some embodiments of the present disclosure, at least a part of the chips is a computing chip having a computing element.

In accordance with some embodiments of the present disclosure, the method for manufacturing the chip package further includes adhering the first surface of the chip to a carrier substrate before laminating the protective layer.

In accordance with some embodiments of the present disclosure, the method for manufacturing the chip package further includes removing the carrier substrate after forming the conductive layer.

In accordance with some embodiments of the present disclosure, the method for manufacturing the chip package further includes connecting the first surface of the chip to a transparent substrate.

In accordance with some embodiments of the present disclosure, connecting the first surface of the chip to the transparent substrate is adhering the first surface of the chip to a dam structure positioned on the transparent substrate.

In accordance with some embodiments of the present disclosure, connecting the first surface of the chip to the transparent substrate is adhering a part of the first surface of the chip to a dam structure positioned on the transparent substrate and connecting another part of the first surface of the chip to a flat plate structure on the transparent substrate.

In accordance with some embodiments of the present disclosure, the method for manufacturing the chip package further includes adhering the second surface of the chip to a carrier substrate before connecting the first surface of the chip to the transparent substrate.

In accordance with some embodiments of the present disclosure, the method for manufacturing the chip package further includes removing the carrier substrate before laminating the protective layer.

In accordance with some embodiments of the present disclosure, the method for manufacturing the chip package further includes forming an insulation layer between the chip and the conductive layer.

In accordance with some embodiments of the present disclosure, further includes forming an external conductive connection on the conductive layer and electrically connecting to the conductive layer.

BRIEF DESCRIPTION OF THE DRAWINGS

In order to make the above-mentioned and other purposes, features, advantages and embodiments of the present disclosure can be more fully understood, the detailed description of drawings accompanied herewith is as follows.

DETAILED DESCRIPTION

Figure 1:
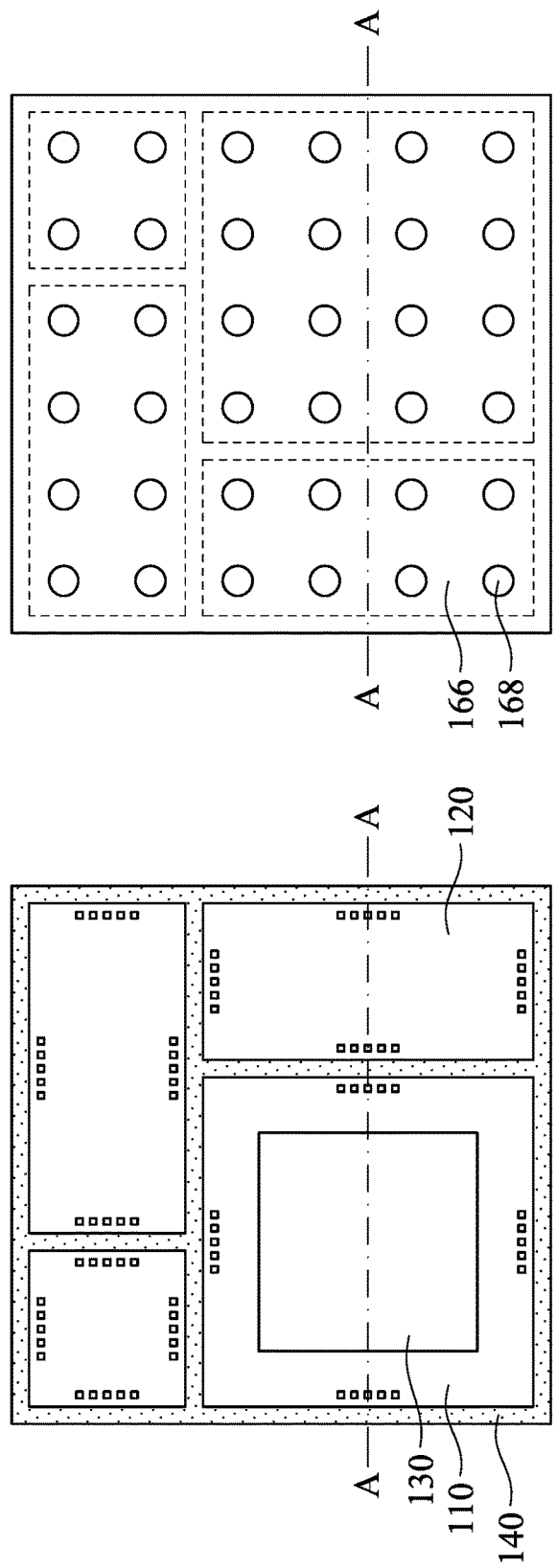
FIGS. 1A and 1B are respectively a top view and a bottom view illustrating a chip package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular terms used in the following include a plurality of things referred to except pointing out especially in the content. Therefore, a chip means embodiments having two or more than two chips except pointing out especially in the content. The "an embodiment" that present disclosure mentions means the specific features, structures or properties relevant to this embodiment are included in at least an embodiment of present disclosure. Hence, the "an embodiment" appearing in many different places in present disclosure does not necessarily mean the same embodiment. In addition, the specific features, structures or properties which are disclosed may be combined with each other in an embodiment or multiple embodiments in a favorable situation. It is understood that the drawings are not drawn to scale and are used for illustration purposes only.

Figure 2:
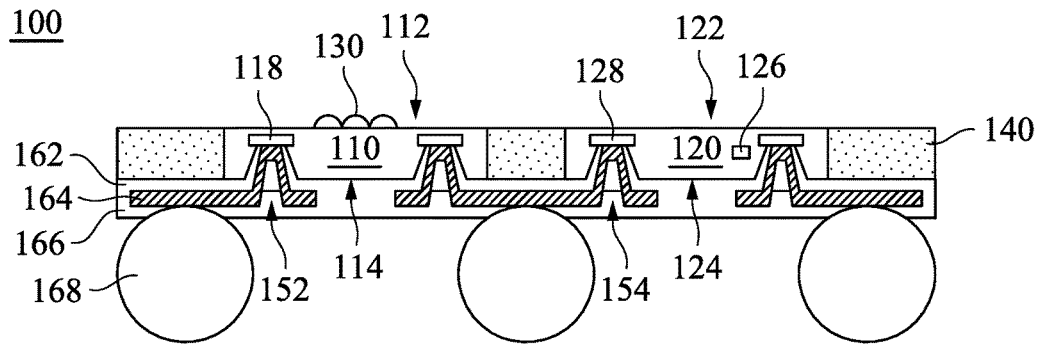
FIGS. 2-4 are the cross-sectional views respectively illustrating various chip packages in accordance with some embodiments of the present disclosure.

Please refer to FIGS. 1A, 1B and 2, which respectively show the top views and the cross-sectional view of a chip package 100 according to some embodiments. FIG. 2 is a cross-sectional view illustrating the chip package 100 along line A-A in FIGS. 1A and 1B. As shown in FIG. 2, the chip package 100 includes a sensing chip 110 and a computing chip 120. The sensing chip 110 comprises a first conductive pad 118, a sensing element 130, a first surface 112 and a second surface 114 opposite to the first surface 112. The sensing element 130 is disposed on the first surface 112 of the sensing chip 110. The computing chip 120 comprises a computing element 126, a second conductive pad 128 and a first surface 122 and a second surface 124 opposite to the first surface 122, in which the first conductive pad 118 is electrically connected to the sensing element 130, and the second conductive pad 128 is electrically connected to the computing element 126.

In some embodiments, each of the sensing chip 110 and the computing chip 120 includes a semiconductor element, an inter-layer dielectric (ILD), an inter-metal dielectric (IMD), a passivation layer and an interconnection metal structure, wherein each of the first conductive pad 118 and the second conductive pad 128 is a metal layer of the interconnection structure. For example, the material of the first conductive pad 118 and the second conductive pad 128 may be aluminum, copper, nickel or other suitable metal material.

In some embodiments, the sensing element 130 may be active elements or passive elements, electronic components of integrated circuits of digital circuits or analog circuits, optoelectronic devices, micro electro mechanical systems (MEMS), micro fluidic systems, or physical sensors which measure physical changes in heat, light, pressure, etc., RF circuits, accelerators, gyroscopes, micro actuators, surface acoustic wave devices, and pressure sensors, but not limited thereto. In the present embodiment, the sensing element 130 is a light sensing element, which has a function of receiving electromagnetic waves or light, for example but not limited thereto, a CMOS image sensor (CIS).

Please continue with FIG. 2, the chip package 100 further comprises a protective layer 140. As shown in FIGS. 1A and 1B, the sensing chip 110 and the computing chip 120 are annularly surrounded by the protective layer 140 which provides electrical insulation between the sensing chip 110 and computing chip 120. It is noted that the protective layer 140 is formed by laminating processes, which may provide better an electrical insulating effect and protective effect during reliability tests, the detailed description is described hereinafter. The material of the protective layer 140 may be epoxy resin.

Please continue with FIG. 2, the chip package 100 further comprises a first via 152 and a second via 154. The first via 152 extends from the second surface 114 of the sensing chip 110 and towards the first surface 112, and exposes the first conductive pad 118. The second via 154 extends from the second surface 124 of the computing chip 120 and towards the first surface 122, and exposes the second conductive pad 128. In addition, a first insulation layer 162 is disposed on the second surface 114 of the sensing chip 110 and the second surface 124 of the computing chip 120, and the first insulation layer 162 covers the sidewalls of the first via 152 and the second via 154, but not covering the first conductive pad 118 in the first via 152 and the second conductive pad 128 in the second via 154. In some embodiments of the present disclosure, the material of the first insulation layer 162 may be silicon oxide, silicon nitride, silicon oxynitride or other suitable insulation materials. In addition, a conductive layer 164 is disposed under the first insulation layer 162, and parts of the conductive layer 164 is disposed in the first via 152 and the second via 154 and further in contact with the first conductive pad 118 and the second conductive pad 128, such that the first conductive pad 118 is electrically connected to the second conductive pad 128. The material of the conductive layer 164 may be, for example, aluminum, copper, nickel or other suitable metal material.

Please continue with FIG. 2, the chip package 100 further comprises a second insulation layer 166 disposed on the second surface 114 of the sensing chip 110 and the second surface 124 of the computing chip 120. The second insulation layer 166 covers the first insulation layer 162 and the conductive layer 164, but not completely fills the first via 152 and the second via 154, thereby forming air gap (not shown) in each of the first via 152 and the second via 154. In addition, an external conductive connection 168 is disposed under the conductive layer 164, and the external conductive connection 168 may be electrically connected to the first conductive pad 118 and the second conductive pad 128 through the conductive layer 164. In other embodiments of the present disclosure, the external conductive connection 168 may be solder balls, bumps or other structures known in the art, and the shape thereof may be round, oval, square, rectangular, but not limited thereto.

It is understood that the elements and materials that have been described will not be described hereinafter to avoid repetition. In the following description, various chip packages in accordance with other embodiments will be described.

Figure 3:
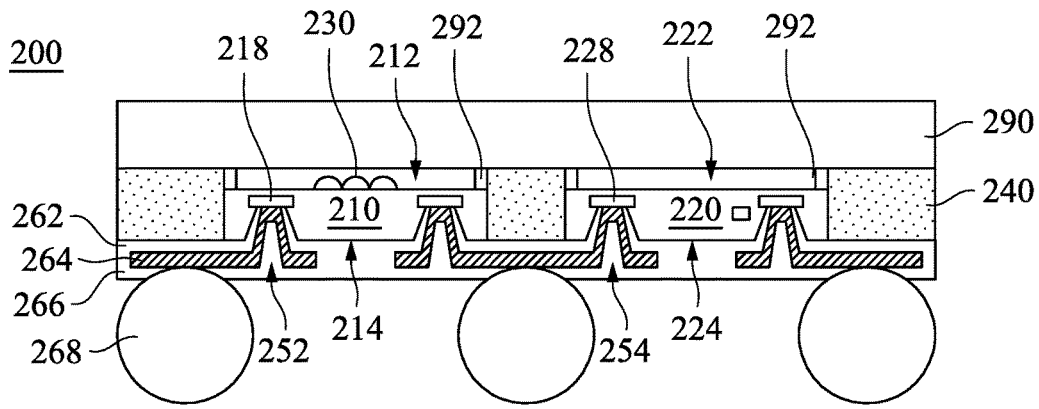

Please refer to FIG. 3, which shows a cross-sectional view illustrating a chip package 200 according to another aspect of other embodiments of the present disclosure. The chip package 200 comprises a sensing chip 210, a computing chip 220, a protective layer 240, a conductive layer 264, and an external conductive connection 268. In addition, the chip package 200 may further comprise other structures similar to the chip package 100 shown in FIG. 2, and which are not repeated herein for the purpose of simplicity. The difference between the chip package 200 and the chip package 100 is that the chip package 200 has a transparent substrate 290 disposed on the first surface 212 of the sensing chip 210 and the first surface 222 of the computing chip 220, and the transparent substrate 290 is connected to the first surface 212 of the sensing chip 210 and the first surface 222 of the computing chip 220 through a dam structure 292 formed on the transparent substrate 290. Light or electromagnetic waves may be transmitted through the transparent substrate 290. It is noted that the dam structure 292 may be a ring structure so as to keep a spacing between the transparent substrate 290 and the sensing chip 210, thus forming a void space between transparent substrate 290 and the sensing chip 210 to protect the sensing element 230. In addition, the chip package 200 further comprises an adhesive layer (not shown) between the dam structure 292 and the sensing chip 210 and between the dam structure 292 and the computing chip 220, such that the dam structure 292 and the first surface 212 of the sensing chip 210 and the first surface 222 of the computing chip can be stably combined. In some embodiments of the present disclosure, the transparent substrate 290 may be glass or quartz, and the dam structure 292 may be epoxy resin, polyamide, photoresist or silicon-based materials.

Figure 4:
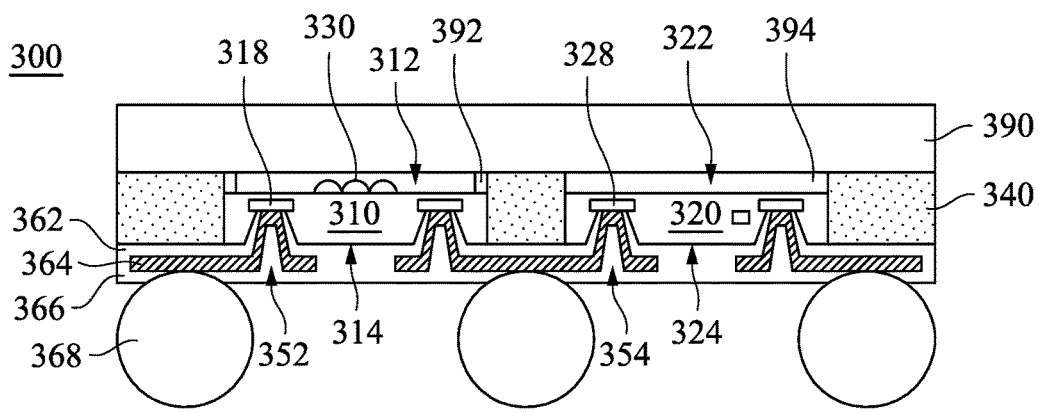

Please refer to FIG. 4, which illustrates a cross-sectional view of a chip package 300 according to another aspect of other embodiments of the present disclosure. The chip package 300 has a sensing chip 310, a computing chip 320, a protective layer 340, a conductive layer 364 and an external conductive connection 368. In addition, the chip package 300 may further comprise other structures similar to the chip package 100 shown in FIG. 2, and which are not repeated herein for the purpose of simplicity. The difference between chip package 300 and chip package 100 is that the chip package 300 has a transparent substrate 390 disposed on the first surface 312 of the sensing chip 310 and the first surface 322 of the computing chip 320, and the transparent substrate 390 is connected to the first surface 312 of the sensing chip 310 through a dam structure 392 formed on the transparent substrate 390 and the first surface 322 of the computing chip 320 is connected to the transparent substrate 390 through a flat plate structure 394 disposed on the first surface 322. Light or electromagnetic waves may be transmitted through the transparent substrate 390. It is noted that the dam structure 392 may be a ring structure so as to keep a spacing between the transparent substrate 390 and the sensing chip 310, thus forming a void space between the transparent substrate 390 and the sensing chip 310 to protect the sensing element 330. In addition, the chip package 300 further comprises an adhesive layer (not shown) between the dam structure 392 and the sensing chip 310 and between the flat plate structure 394 and the transparent substrate 390, such that the dam structure 392 and the first surface 212 of the sensing chip 210, and the flat plate structure 394 and the transparent substrate 390 can be stably combined. In some embodiments of the present disclosure, the transparent substrate 390 may be a glass or quartz, and the dam structure 392 and the flat plate structure 394 may be epoxy resin, polyamide, photoresist or silicon-based materials.

Next, please refer to FIGS. 5 and 6A-6G, the former is a flowchart illustrating a method for manufacturing the chip package 100 shown in FIG. 2, and the latter are the cross-sectional views illustrating various process stages associated with the chip package 100 in FIG. 2. The flowchart of the manufacturing process merely shows the relevant parts of the overall manufacturing process. Additional steps can be provided before, during and after the steps shown in FIG. 5, and some steps described hereinafter can be replaced, removed or changed when adding additional embodiments in the present method. The order of the steps/processes can be exchanged unrestrainedly.

Figure 5:
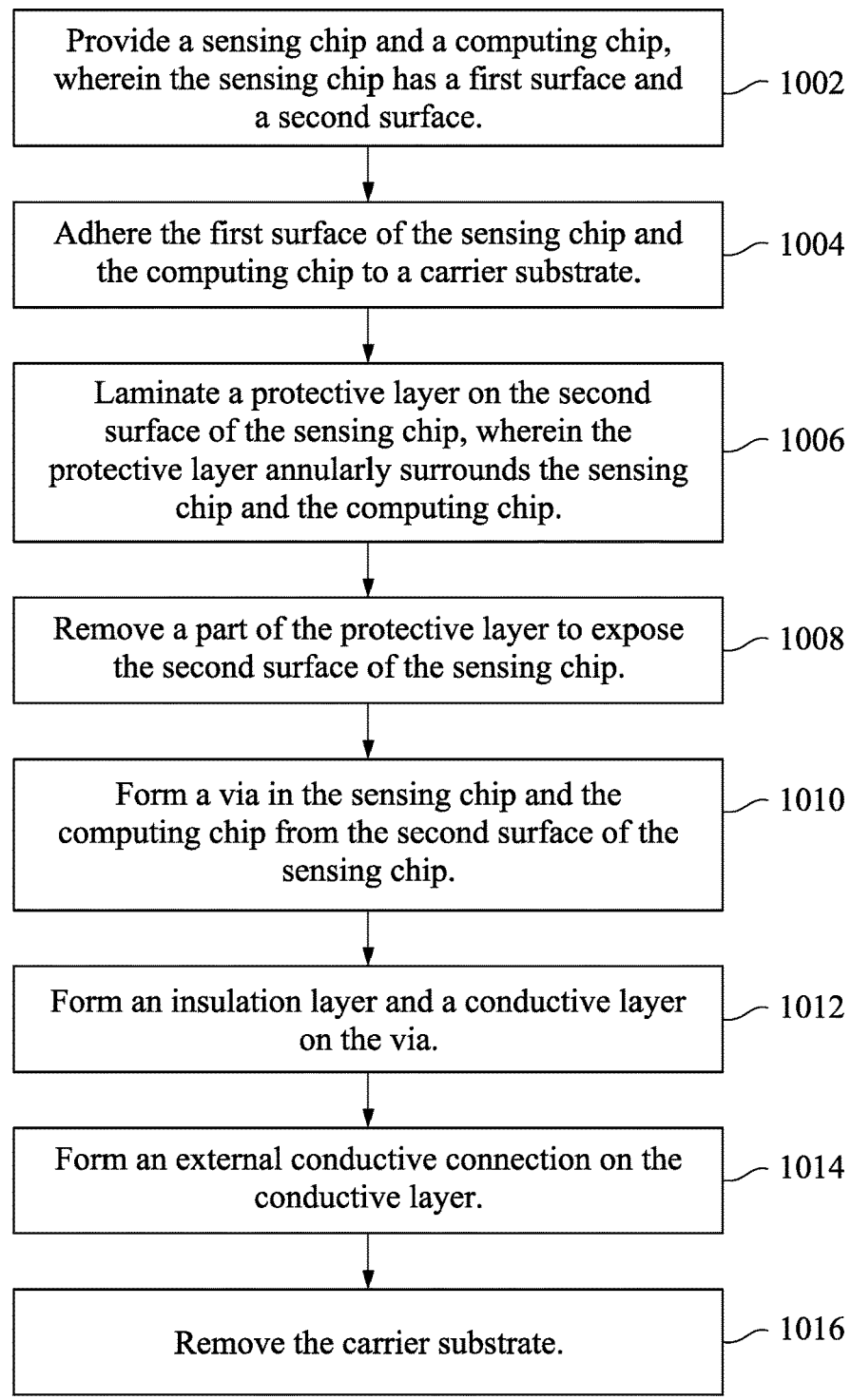
FIG. 5 is a flowchart illustrating a method for manufacturing a chip package in accordance with some embodiments of the present disclosure.
Figure 6A:
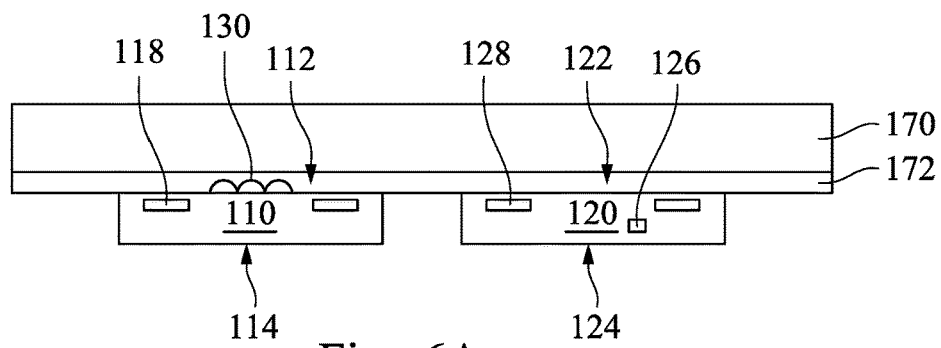
FIGS. 6A-6G are the cross-sectional views illustrating various process stages associated with the chip package depicted in FIG. 2 in accordance with some embodiments of the present disclosure.

Please continue with FIGS. 5 and 6A, a method 1000 starts from a step 1002 by providing a sensing chip 110 and a computing chip 120. The sensing chip 110 has a first surface 112 and a second surface 114, and the computing chip 120 has a first surface 122 and a second surface 124. In addition, each of the sensing chip 110 and the computing chip 120 comprises a semiconductor element, an inter-layer dielectric (ILD), an inter-metal dielectric (IMD), a passivation layer and an interconnection metal structure, wherein each of a first conductive pad 118 and a second conductive pad 128 is one of the metal layers of the interconnection metal structure. For convenience of illustration, the sensing chip 110 of all the embodiments of the present disclosure comprises at least a sensing element 130 and at least a first conductive pad 118, and the computing chip 120 comprises a computing element 126 and at least a second conductive pad 128, wherein the sensing element 130 is disposed on the first surface 112 of the sensing chip 110 and the first conductive pad 118 is disposed under the first surface 112 and electrically connected to the sensing element 130. It is noted that the computing element 126 and the second conductive pad 128 may be disposed at any position inside the computing chip 120, and may be electrically connected to each other. In addition, the sensing chip 110 and computing chip 120 may be single chips, or each may be a plurality of chips. In other words, the types and quantities of the chips in the chip package of the present disclosure are not limited to which FIG. 6A shows. In addition, for example, the material of the first conductive pad 118 and the second conductive pad 128 may be aluminum, copper, nickel or other suitable metal materials.

Please continue with FIGS. 5 and 6A. The method 1000 proceeds to a step 1004 by adhering the first surface 112 of the sensing chip 110 and the first surface 122 of the computing chip 120 to a carrier substrate 170. In some embodiments of the present disclosure, the sensing chip 110 and the computing chip 120 may be stably adhered to the carrier substrate 170 by an adhesive layer 172, for example, such that the structure there between is firmly combined.

Figure 6B:
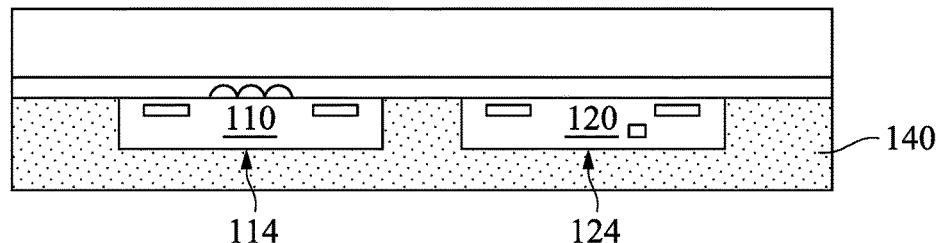

Please continue with FIGS. 5 and 6B, the method 1000 proceeds to a step 1006 by laminating a protective layer 140 on the second surface 114 of the sensing chip 110 and the second surface 124 of the computing chip 120. The sensing chip 110 and the computing chip 120 are annularly surrounded by the protective layer 140. The protective layer 140 formed by lamination may be a tape made from epoxy resin. Specifically, the tape is preheated and then laminated on the second surface 114 of the sensing chip 110 and the second surface 124 of the computing chip 120 and filled in the gap between the sensing chip 110 and the computing chip 120 by a roller or other methods. Subsequently, the tape is hardened to form the protective layer 140 by suitable heating treatment. It is noted that the size of the tape is greater than the sensing chip 110 and the computing chip 120 so that the protective layer 140 formed later annularly surrounds the sensing chip 110 and the computing chip 120 in a top view (as shown in FIG. 1A). In addition, the tape may completely fill the gap between the chips by properly tuning the process parameters, such as the physical or chemical properties of the tape, the pressure of the lamination and the spacing between the chips, so that the protective layer 140 formed later may contribute to a relatively lower leakage current. In the following reliability test, the protective layer 140 mentioned above can provide better protective effect. In addition, as compared to conventional packaging processes which need additional mold, the packaging process having the laminating step may manufacture chip packages faster, simpler, and with lower cost, according to the present disclosure.

Figure 6C:
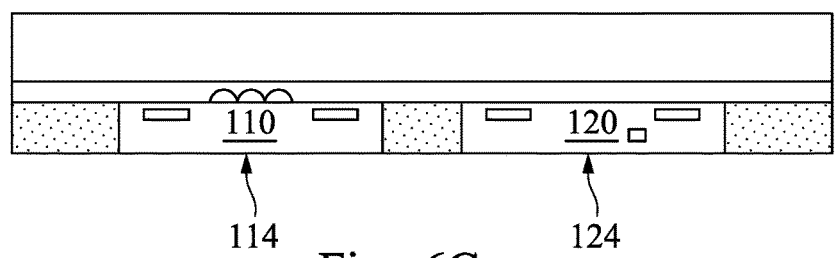

Please continue with FIGS. 5 and 6C, the method 1000 proceeds to a step 1008 by removing a part of the protective layer 140 to expose the second surface 114 of the sensing chip 110 and the second surface 124 of the computing chip 120 by a thinning process. In addition, after the second surface 114 of the sensing chip 110 and the second surface 124 of the computing chip 120 are exposed, the thinning process may be continuously performed on the second surface 114 of the sensing chip 110 and the second surface 124 of the computing chip 120 so that the sensing chip 110 and the computing chip 120 reach a desired thickness, which facilitates to the subsequent fabrication of the through-silicon via (TSV). The thinning process may generally include etching, milling, grinding, or polishing.

Figure 6D:
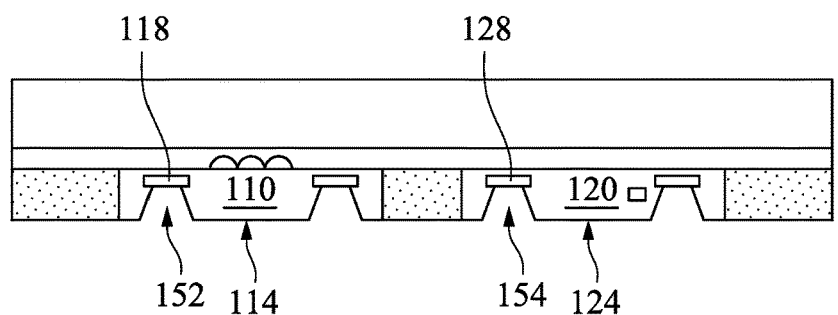

Please continue with FIGS. 5 and 6D, the method 1000 proceeds to a step 1010 by forming a first via 152 from the second surface 114 of the sensing chip 110 to expose the first conductive pad 118 and forming a second via 154 from the second surface 124 of the computing chip 120 to expose the second conductive pad 128. The method for forming the first via 152 and the second via 154 may be, for example, lithography etching, but is not limited thereto. The etching may be dry etching or wet etching, for example. The first via 152 and the second via 154 may be tilted openings or vertical openings, and the shape thereof in top view may be any shape such as round, oval, square, rectangular, or other suitable shapes.

Figure 6E:
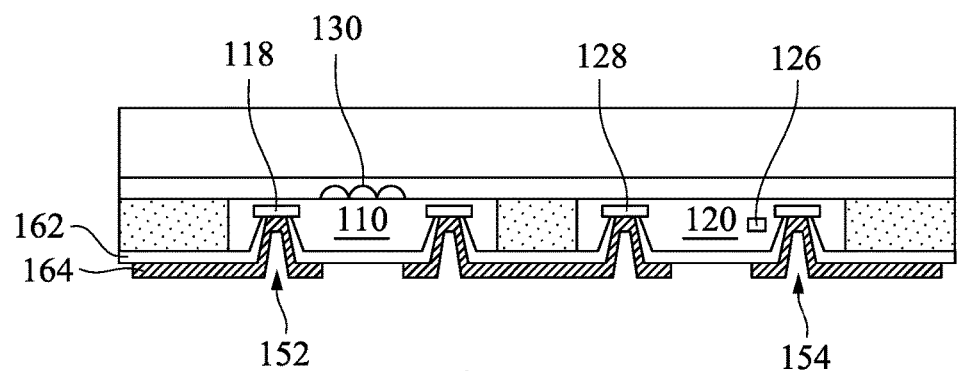

Please continue with FIGS. 5 and 6E, the method 1000 proceeds to a step 1012 by forming a first insulation layer 162 and a conductive layer 164 in the first via 152 and the second via 154. The first insulation layer 162 is used for insulating the sensing chip 110 and the computing chip 120 from the conductive layer subsequently formed. The material of the first insulation layer 162 may be, for example, epoxy resin, solder resist or other suitable insulating material such as silicon oxide, silicon nitride, silicon oxynitride, metal oxide, or a combination thereof. For example, the first insulation layer 162 may be formed by coating or depositing approaches. The coating approaches may be spin coating or spray coating, for example. The depositing approaches is may be physical vapor deposition, chemical vapor deposition, low pressure chemical vapor deposition, plasma enhanced chemical vapor deposition, rapid thermal chemical vapor deposition, or atmospheric chemical vapor deposition, for example. It is noted that the first conductive pad 118 and the second conductive pad 128 are not completely covered by the first insulation layer 162.

Thereafter, as shown in FIG. 6E, the conductive layer 164 is formed under the first insulation layer 162. For example, the conductive layer 164 may be manufactured by sputtering, vapor deposition, electroplating or electroless plating, and the material thereof may be aluminum, copper, nickel or other suitable conductive materials. A conductive material may be firstly deposited covering the first insulation layer 162, the first conductive pad 118 and the second conductive pad 128, and then the conductive material mentioned above is patterned by lithography etching so as to form the conductive layer 164 under the first insulation layer 162. Portions the conductive layer 164 are positioned in the first via 152 and the second via 154 and further in contact with the first conductive pad 118 and the second conductive pad 128 so as to electrically connect to the first conductive pad 118 and the second conductive pad 128. A signal transmission route of the chip package subsequently formed may be redistributed by the step of patterning the conductive material mentioned above. It is noted that the conductive layer 164 may connect the sensing element 130 of the sensing chip 110 with the computing element 126 of the computing chip 120 through the first conductive pad 118 and the second conductive pad 128, respectively, so to input, output and control signals.

Figure 6F:
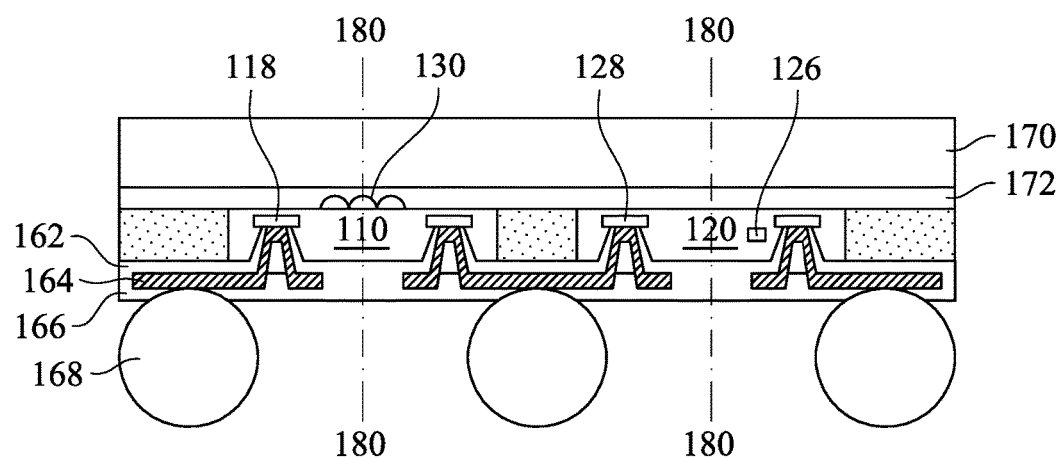

Please continue with FIGS. 5 and 6F, the method 1000 proceeds to a step 1014 by forming a second insulation layer 166 and an external conductive connection 168 under the conductive layer 164. The second insulation layer 166 may be formed under the conductive layer 164 by using the process and material of the aforementioned first insulation layer 162. Then, the external conductive connection 168 is formed under the second insulation layer 166. In some embodiments of the present disclosure, the external conductive connection 168 may be solder balls, bumps or other structures known in the art, and the shape thereof may be round, oval, square, or rectangular, but not limited thereto. It is noted that the external conductive connection 168 may be connected to a printed circuit board in the subsequent processes such that the sensing element 130 is electrically connected to the printed circuit board through the first conductive pad 118, the conductive layer 164 and the external conductive connection 168 for signal input or output. Similarly, the external conductive connection 168 renders the computing element 126 being electrically connected to the printed circuit board through the second conductive pad 128, the conductive layer 164 and the external conductive connection 168 for signal input or output.

It is noted that, after forming the external conductive connection 168, the sensing chip 110 and the computing chip 120 may be cut along the scribing line 180 such that the cut sensing chip and computing chip form individual chip packages with the sensing and computing functions. Specifically, the scribing lines 180 are respectively next to the first conductive pad 118 and the second conductive pad 128. The adjacent two chips may be separated so as to form individual chip packages by cutting the second insulation layer 166, the first insulation layer 162, the sensing chip 110 or computing chip 120, the adhesive layer 172 and the carrier substrate 170 in sequence along the scribing line 180. It is noted that, in other embodiments, the sensing element may be two separated parts and the scribing line may be positioned between the two separated parts of the sensing element.

Figure 6G:
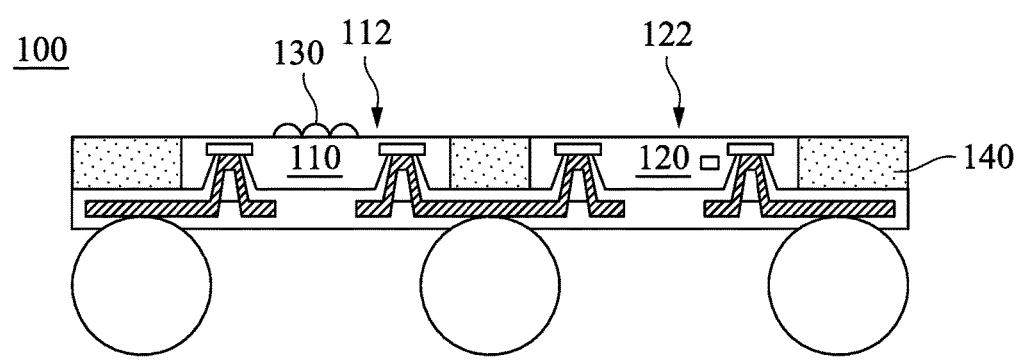

Please continue with FIGS. 5 and 6G, the method 1000 proceeds to a step 1016 by removing the carrier substrate 170. Heating treatment, ultraviolet light illuminating treatment or other suitable approaches may be used to deprive the adhesive layer 172 of adhesion between the carrier substrate 170 and each of the sensing chip 110 and the computing chip 120 so as to remove the carrier substrate 170 from the sensing chip 110 and the computing chip 120. It is noted that after the removal of the carrier substrate 170 and the adhesive layer 172, there is no shelter over the sensing element 130 (which is on the first surface 112 of the sensing chip 110). In the present embodiment, there is no shelter on the first surface 122 of the computing chip 120, either.

It is understood that the elements and materials and the manufacturing methods thereof that have been described will not be described hereinafter to avoid repetition. In the following description, various methods for forming chip packages in accordance with other embodiments will be described.

Please refer to FIGS. 7 and 8A-8G, the former illustrates a flowchart of manufacturing the chip package 200 shown in FIG. 3, and the latter illustrates the cross-sectional views illustrating various process stages associated with the chip package 200 depicted in FIG. 3. The flowchart of the process merely shows the relevant part of the overall manufacturing process. Additional steps can be provided before, during and after the steps shown in FIG. 7, and some steps described hereinafter can be replaced, removed or changed when adding additional embodiments in the present method. The order of the steps/processes can be exchanged unrestrainedly.

Figure 7:
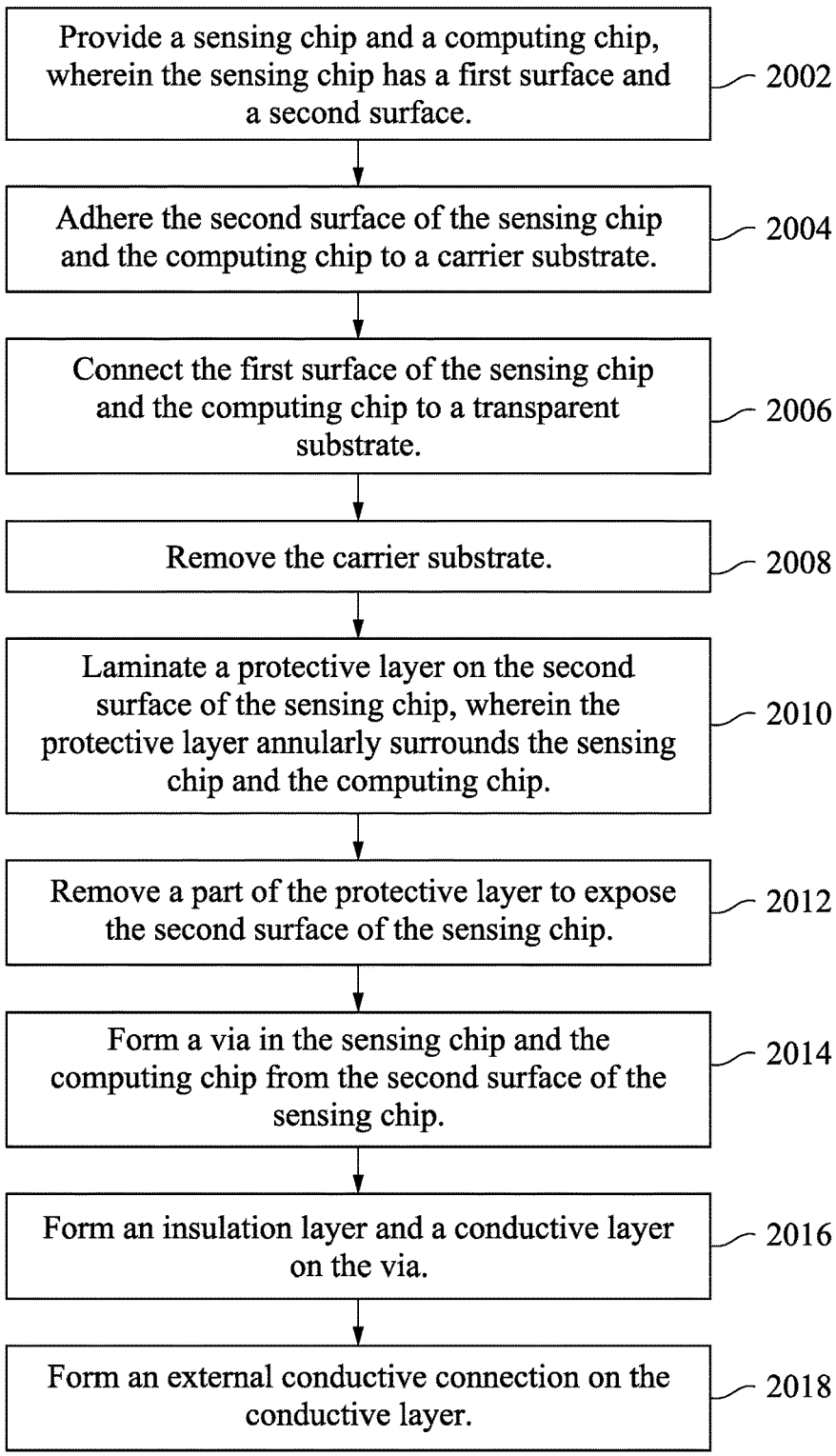
FIG. 7 is a flowchart illustrating a method for manufacturing a chip package in accordance with some embodiments of the present disclosure.
Figure 8A:
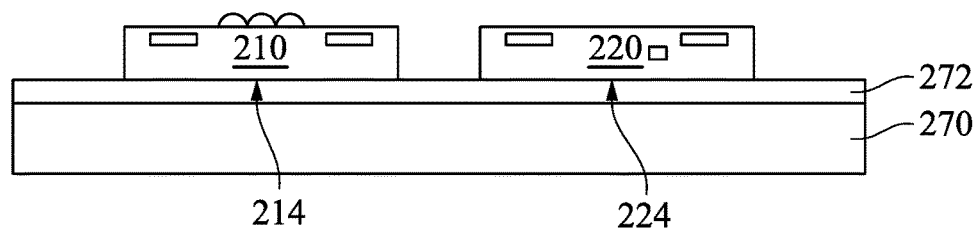
FIGS. 8A-8G are the cross-sectional views illustrating various process stages associated with the chip package depicted in FIG. 3 in accordance with some embodiments of the present disclosure.

Please continue with FIGS. 7 and 8A, a method 2000 starts from a step 2002 by providing a sensing chip 210 and a computing chip 220. The sensing chip 210 and the computing chip 220 are the same as the sensing chip 110 and the computing chip 120 of the chip package 100 shown in FIG. 6A and which are not repeated herein. It is noted that, as mentioned hereinbefore, the sensing chip 210 and the computing chip 220 each may be a single chip or each may include a plurality of chips. In other words, the types and quantities of chips in the chip package of the present disclosure are not limited to that shown in FIG. 8A.

Please continue with FIGS. 7 and 8A, the method 2000 proceeds to a step 2004 by adhering the second surface 214 of the sensing chip 210 and the second surface 224 of the computing chip 220 to a carrier substrate 270. As mentioned hereinbefore, the sensing chip 210 and the computing chip 220 are bonded to the carrier substrate 270 through an adhesive layer 272.

Figure 8B:
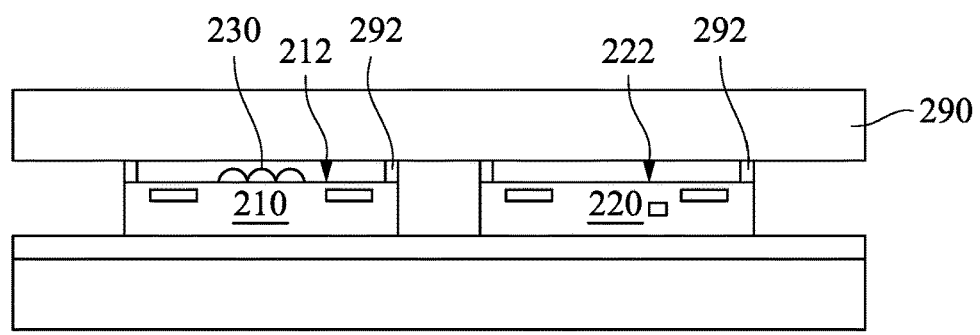

Please continue with FIGS. 7 and 8B, the method 2000 proceeds to a step 2006 by connecting the first surface 212 of the sensing chip 210 and the first surface 222 of the computing chip 220 to a transparent substrate 290. As shown in FIG. 8B, the sensing chip 210 and the computing chip 220 are connected to the transparent substrate 290 through a dam structure 292 positioned on the transparent substrate 290. Light or electromagnetic waves may transmit through the transparent substrate 290. It is noted that the dam structure 292 may be a ring structure so as to keep a spacing between the transparent substrate 290 and the sensing chip 210, thus forming a void space between the transparent substrate 290 and the sensing chip 210 to protect the sensing element 230. In addition, the chip package 200 further comprises an adhesive layer (not shown) between the dam structure 292 and the sensing chip 210 and between the dam structure 292 and the computing chip 220 such that the dam structure 292 and the first surface 212 of the sensing chip 210 and the first surface 222 of the computing chip 220 can be stably combined. In some embodiments of the present disclosure, the transparent substrate 290 may be glass or quartz, and the dam structure 292 may be epoxy resin, polyamide, photoresist or silicon based materials.

Figure 8C:
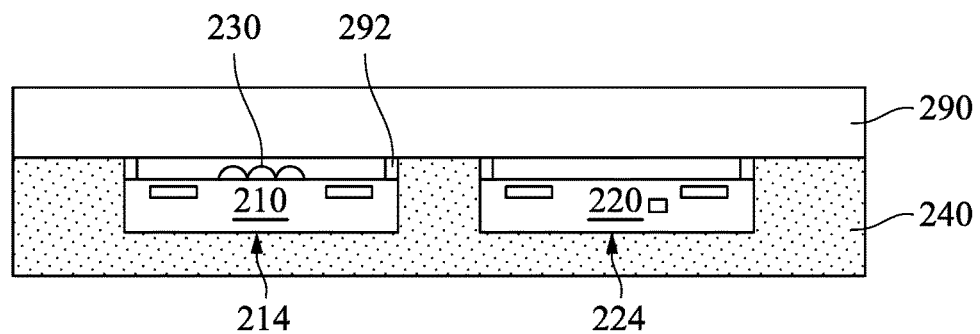

Please continue with FIGS. 7 and 8C, the method 2000 proceeds to a step 2008 by removing the carrier substrate 270. The method for removing the carrier substrate 270 is the same as these described hereinbefore in connection with FIG. 6G, and therefore is not repeated herein.

Next, the method 2000 proceeds to a step 2010 by laminating a protective layer 240 on the second surface 214 of the sensing chip 210 and the second surface 224 of the computing chip 220. The sensing chip 210 and the computing chip are annularly surrounded by the protective layer 240. The method for laminating the protective layer 240 is the same as these described hereinbefore in connection with FIG. 6B, and therefore is not repeated herein. It is noted that the protective layer 240 is not filled in the dam structure 292 since the dam structure 292 forms a ring structure surrounding a hermetic space. In other words, the protective layer 240 is not filled in the space surrounding the sensing element 230.

Figure 8D:
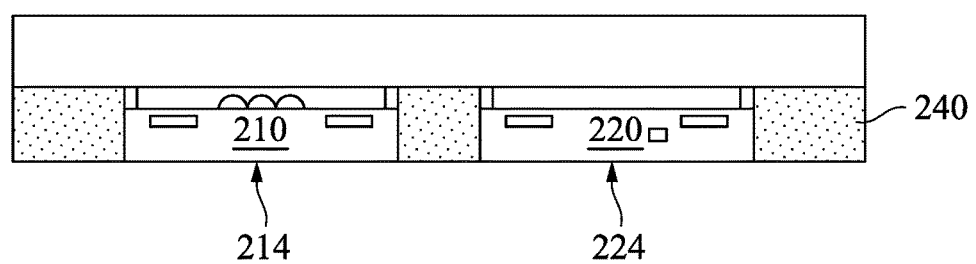

Please continue with FIGS. 7 and 8D, the method 2000 proceeds to a step 2012 by removing a part of the protective layer 240 to expose the second surface 214 of the sensing chip 210 by a thinning process. As mentioned hereinbefore, after the second surface 214 of the sensing chip 210 and the second surface 224 of the computing chip 220 are exposed, the thinning process may be continuously performed thereon so that the sensing chip 210 and the computing chip 220 may reach a desired thickness. The thinning process is the same as these described hereinbefore in connection with FIG. 6C, and therefore is not repeated herein.

Figure 8E:
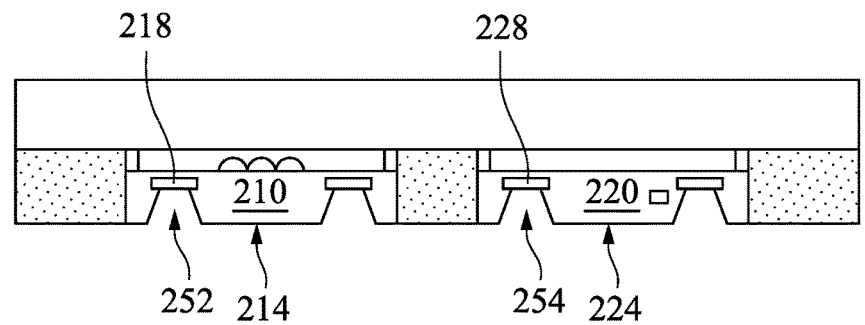

Please continue with FIGS. 7 and 8E, the method 2000 proceeds to a step 2014 by forming a first via 252 exposing the conductive pad 218 from the second surface 214 of the sensing chip 210, and forming a second via 254 exposing the conductive pad 228 from the second surface 224 of the computing chip 220. The shapes and forming methods of the first via 252 and the second via 254 are the same as these described hereinbefore in connection with FIG. 6D, and therefore are not repeated herein.

Figure 8F:
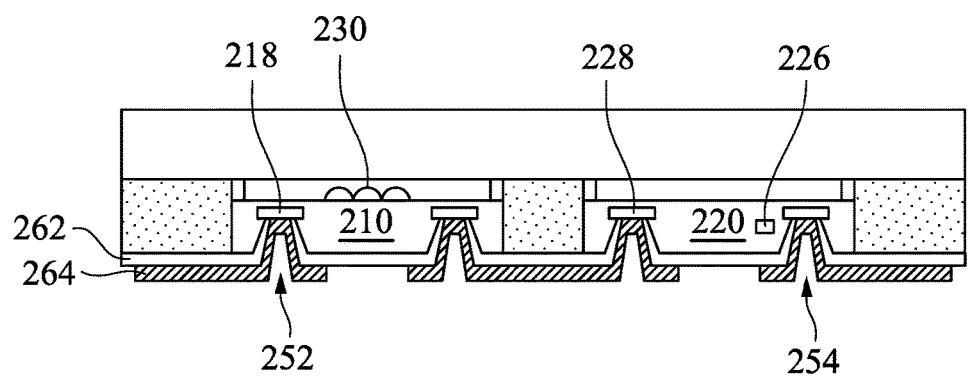

Please continue with FIGS. 7 and 8F, the method 2000 proceeds to a step 2016 by forming a first insulation layer 262 and a conductive layer 264 in the first via 252 and the second via 254. The first insulation 262 is used for insulating the sensing chip 210 and the computing chip 220 from the conductive layer subsequently formed. The conductive layer 264 may connect the sensing element 230 of the sensing chip 210 to the computing element 226 of the computing chip 220 through the first conductive pad 218 and the second conductive pad 228, respectively, so as to input or output signal. It is noted that the first conductive pad 218 and the second conductive pad 228 are not completely covered by the first insulation layer 262, and the conductive layer 264 is in direct contact with and electrically connected to the first conductive pad 218 and the second conductive pad 228. The materials, shapes and the forming methods of the first insulation layer 262 and the conductive layer 264 are the same as these described hereinbefore in connection with FIG. 6E, and therefore are not repeated herein.

Figure 8G:
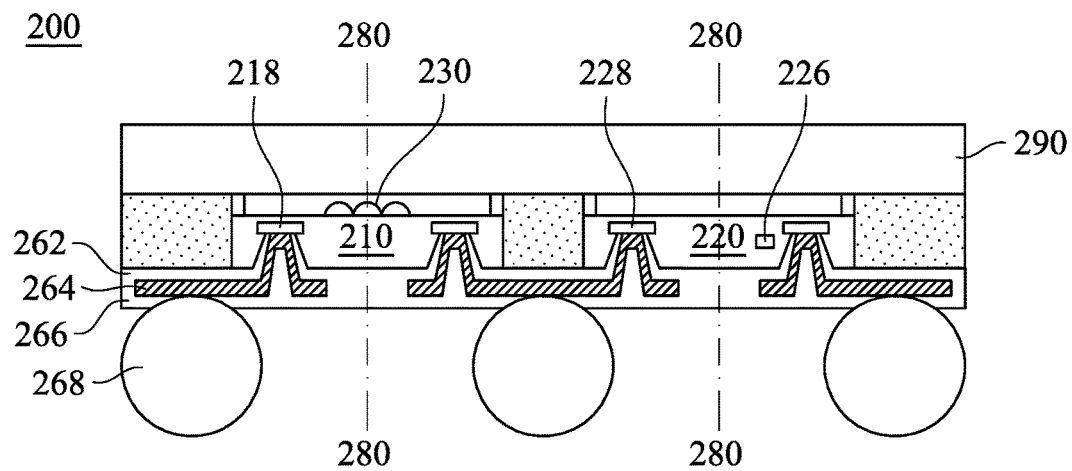

Please continue with FIGS. 7 and 8G, the method 2000 proceeds to a step 2018 by forming a second insulation layer 266 and an external conductive connection 268 under the conductive layer 264. It is noted that the external conductive connection 268 may be connected to a printed circuit board in the subsequent processes so that the sensing element 230 may be electrically connected to the printed circuit board through the first conductive pad 218, the conductive layer 264 and the external conductive connection 268 for signal input and output. Similarly, the external conductive connection 268 renders the computing element 226 being electrically connected to the printed circuit board through the second conductive pad 228, the conductive layer 264 and the external conductive connection 268 for signal input and output. The materials, shapes and the forming methods of the second insulation layer 266 and the external conductive connection 268 are the same as these described hereinbefore in connection with FIG. 6F, and therefore are not repeated herein.

It is noted that, after forming the external conductive connection 268, the sensing chip 210 and the computing chip 220 may be cut along the scribing line 280 such that the cut sensing chip and computing chip form individual chip packages with the sensing and computing functions. Specifically, the scribing lines 280 may be respectively next to the first conductive pad 218 and the second conductive pad 228. The adjacent two chips may be separated to form individual chip packages by cutting the second insulation layer 266, the first insulation layer 262, the sensing chip 210 or computing chip 220, and the transparent substrate 290 in sequence along the scribing line 280. It is noted that the sensing element may be two separated parts and the scribing line may be positioned between the two separated parts of the sensing element in other embodiments.

Please refer to FIGS. 9 and 10A-10F next, the former illustrates a flowchart of manufacturing the chip package 300 shown in FIG. 4, and the latter illustrates the cross-sectional views illustrating various process stages associated with the chip package 300 depicted in FIG. 4. The flowchart of the process merely shows the relevant part of the overall manufacturing process. Additional steps can be provided before, during and after the steps shown in FIG. 9, and some steps described hereinafter can be replaced, removed or changed when adding additional embodiments in the present method. The order of the steps/processes can be exchanged unrestrainedly.

Figure 9:
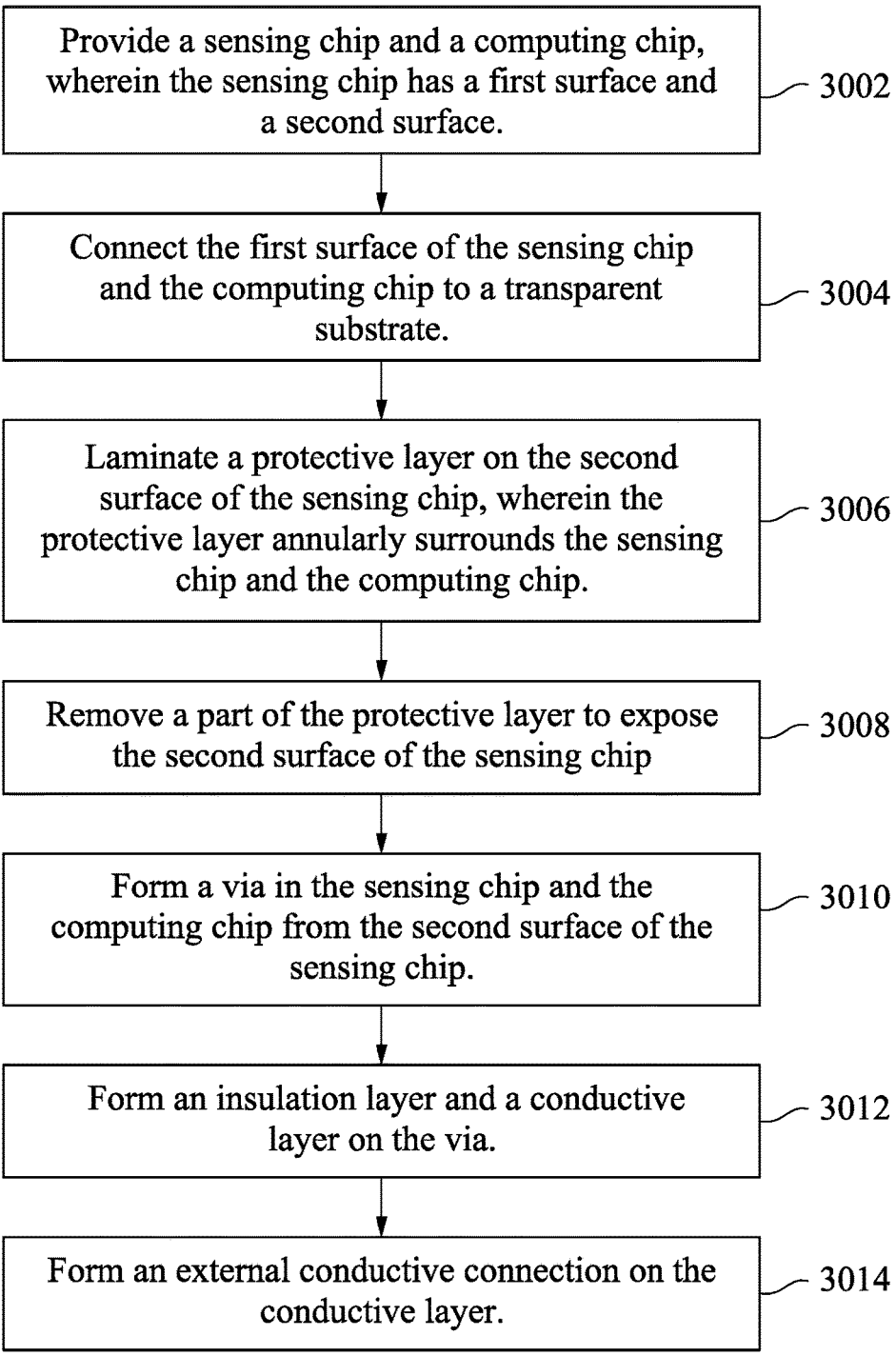
FIG. 9 is a flowchart illustrating a method for manufacturing a chip package in accordance with some embodiments of present disclosure.
Figure 10A:
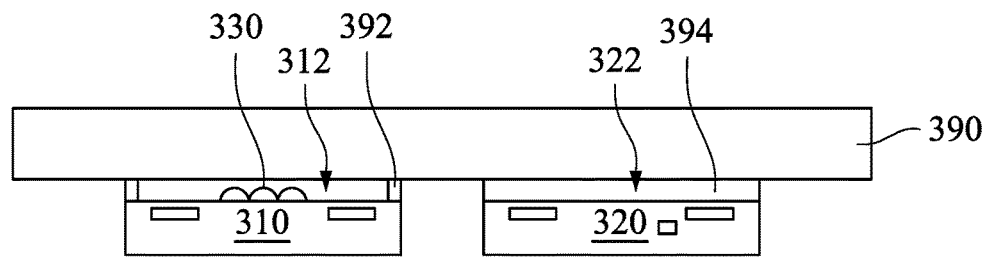
FIGS. 10A-10F the cross-sectional views illustrating various process stages associated with the chip package depicted in FIG. 4 in accordance with some embodiments of the present disclosure.

Please continue with FIGS. 9 and 10A, a method 3000 starts from a step 3002 by providing a sensing chip 310 and a computing chip 320. The sensing chip 310 and the computing chip 320 are the same as the sensing chip 110 and the computing chip 120 of the chip package 100 shown in FIG. 6A and which are not repeated herein therefore. It is noted that, as mentioned hereinbefore, the sensing chip 310 and computing chip 320 each may be a single chip or each may include a plurality of chips. In other words, the types and quantities of chips in the chip package of the present disclosure are not limited to that shown in FIG. 10A.

Please continue with FIGS. 9 and 10A, the method 3000 proceeds to a step 3004 by connecting the first surface 312 of the sensing chip 310 and the first surface 322 of the computing chip 320 to a transparent substrate 390. As shown in FIG. 10A, the sensing chip 310 and the computing chip 320 are connected to the transparent substrate 390 respectively through a dam structure 392 positioned on the transparent substrate 390 and a flat plate structure 394 over the first surface 322 of the computing chip 320. Light or electromagnetic waves may be transmitted through the transparent substrate 390. It is noted that the dam structure 392 is a ring structure so as to keep a spacing between the transparent substrate 390 and the sensing chip 310, thus forming a void space between the transparent substrate 390 and the sensing chip 310 to protect the sensing element 330. In addition, the chip package 300 further comprises an adhesive layer (not shown) between the dam structure 392 and the sensing chip 310 and between the flat plate structure 394 and the computing chip 320 such that the interface between dam structure 392 and the first surface 312 of the sensing chip 310 and the interface between transparent substrate 390 and the first surface 322 of the computing chip 320 can be stably combined. In some embodiments of the present disclosure, the transparent substrate 390 may be glass or quartz, and the dam structure 392 may be epoxy resin, polyamide, photoresist or silicon based materials. In other embodiments, the flat plate structure may be an adhesive layer.

It is noted that, unlike the dam structure 392, the flat plate structure 394 is first adhered on the first surface 322 of the computing chip 320, and then obtained structure is adhered onto the transparent substrate 390 through an adhesive layer (not shown). In this way, the computing chip 320 may be pasted on the desired position more precisely. The position of the computing chip 320 may also be managed in this step. The computing chip 320 is unlike the dam structure 392 which is limited to the dam structure 392 fixed on the transparent substrate 390.

Figure 10B:
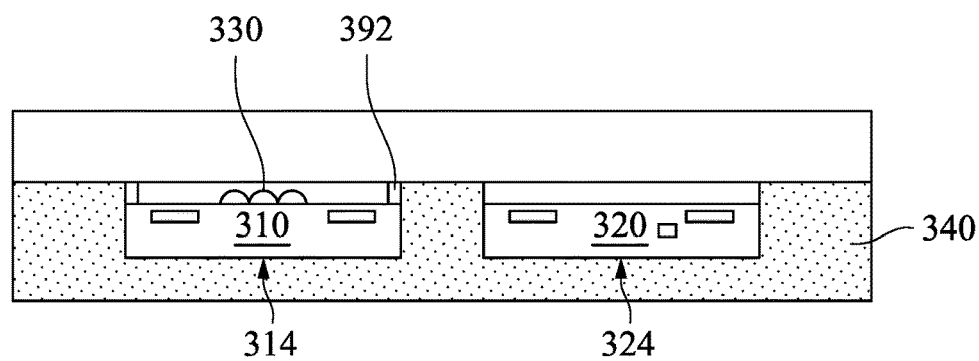
Figure 10C:
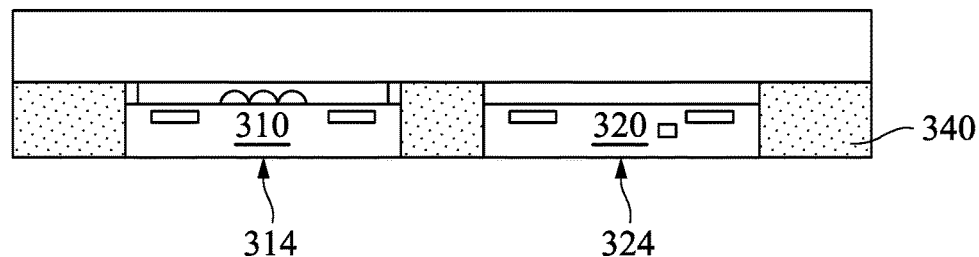

Please continue with FIGS. 9 and 10B, the method 3000 proceeds to a step 3006 by laminating a protective layer 340 on the second surface 314 of the sensing chip 310, in which the protective layer 340 annularly surrounds the sensing chip 310 and the computing chip 320. The method for laminating the protective layer 340 is the same as these described hereinbefore in connection with FIG. 6B, and therefore is not repeated herein. It is noted that the protective layer 340 is not filled in the dam structure 392 since the dam structure 392 forms a ring structure surrounding a hermetic space. In other words, the protective layer 340 is not filled in the space surrounding the sensing element 330.

Please continue with FIGS. 9 and 10O, the method 3000 proceeds to a step 3008 by removing a part of the protective layer 340 to expose the second surface 314 of the sensing chip 310 by a thinning process. As mentioned hereinbefore, after the second surface 314 of the sensing chip 310 and the second surface 324 of the computing chip 320 are exposed, the thinning process may be continuously performed thereon so that the sensing chip 310 and the computing chip 320 may reach a desired thickness. The thinning process is the same as these described hereinbefore in connection with FIG. 6C, and therefore is not repeated herein.

Figure 10D:
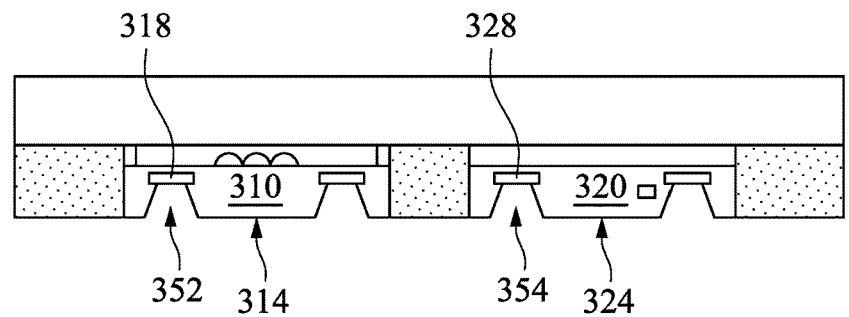

Please continue with FIGS. 9 and 10D, the method 3000 proceeds to a step 3010 by forming a first via 352 exposing the first conductive pad 318 from the second surface 314 of the sensing chip 310 and forming a second via 354 exposing the second conductive pad 328 from the second surface 324 of the computing chip 320. The shapes and the forming methods of the first via 352 and the second via 354 are the same as these described hereinbefore in connection with FIG. 6D, and therefore are not repeated herein.

Figure 10E:
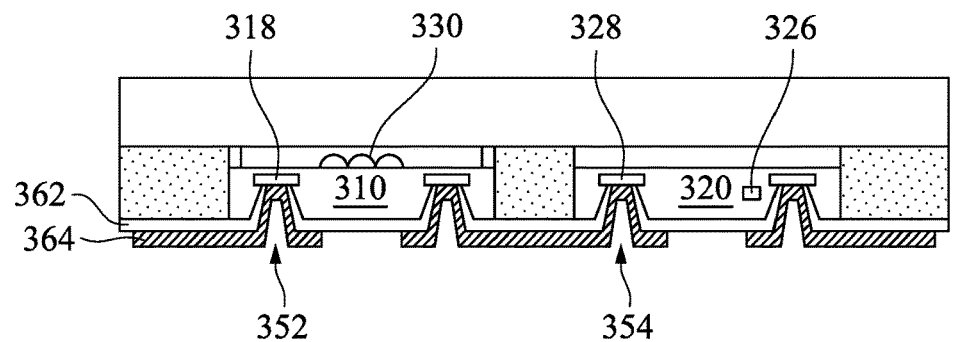

Please continue with FIGS. 9 and 10E, the method 3000 proceeds to a step 3012 by forming a first insulation layer 362 and a conductive layer 364 in the first via 352 and the second via 354. The first insulation layer 362 is used for insulating the sensing chip 310 and the computing chip 320 from the conductive layer subsequently formed. The conductive layer 364 may connect the sensing element 330 of the sensing chip 310 to the computing element 326 of the computing chip 320 through the first conductive pad 318 and the second conductive pad 328, respectively, to input or output signal. It is noted that the first conductive pad 318 and the second conductive pad 328 are not completely covered by the first insulation layer 362, and the conductive layer 364 is in direct contact with and electrically connected to the first conductive pad 318 and the second conductive pad 328. The materials, shapes and the forming methods of the first insulation layer 362 and the conductive layer 364 are the same as these described hereinbefore in connection with FIG. 6E, and therefore are not repeated herein.

Figure 10F:
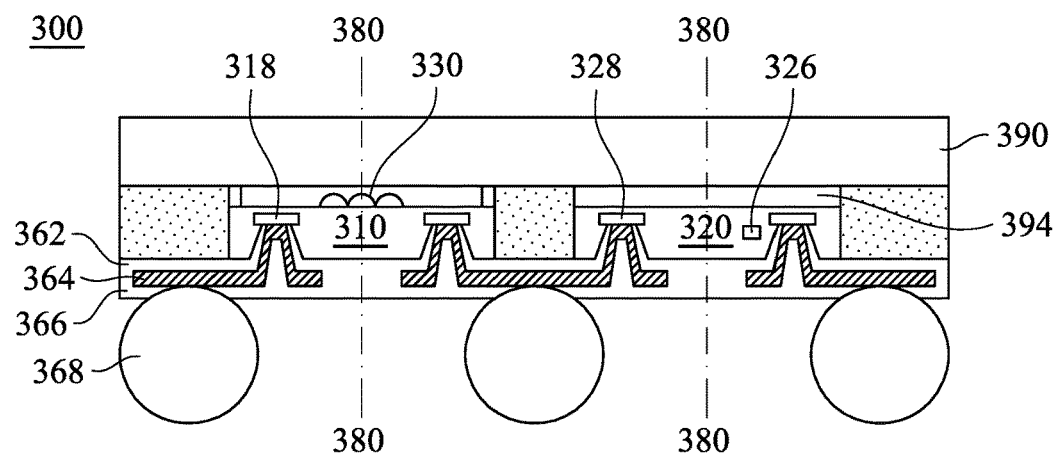

Please continue with FIGS. 9 and 10F, the method 3000 proceeds to a step 3014 by forming a second insulation layer 366 and an external conductive connection 368 under the conductive layer 364. It is noted that the external conductive connection 368 may be connected to a printed circuit board in the subsequent processes so that the sensing element 330 may be electrically connected to the printed circuit board and input and output signal through the first conductive pad 318, the conductive layer 364 and the external conductive connection 368 for signal input and output. Similarly, the external conductive connection 368 renders the computing element 326 being electrically connected to the printed circuit board through the second conductive pad 328, the conductive layer 364 and the external conductive connection 368 for signal input and output. The materials, shapes and the forming methods of the second insulation layer 366 and the external conductive connection 368 are the same as these described hereinbefore in connection with FIG. 6F, and therefore are not repeated herein.

It is noted that after forming the external conductive connection 368, the sensing chip 310 and the computing chip 320 may be cut along the scribing line 380 such that the cut sensing chip and computing chip form individual chip packages with the sensing and computing functions. Specifically, the scribing lines 380 are respectively next to the first conductive pad 318 and the second conductive pad 328. The adjacent two chips may be separated to form individual chip packages by cutting the second insulation layer 366, the first insulation layer 362, the sensing chip 310 or computing chip 320, and the transparent substrate 390 in sequence along the scribing line 380. It is noted that the sensing element may be two separated parts and the scribing line may be positioned between the two separated parts of the sensing element in other embodiments.

From the description of the embodiments according to the present disclosure, the present disclosure has the advantages described below. The chip package according to the present disclosure has a computing chip (or integrated circuit) and a sensing chip (or image sensing element), and therefore may effectively decrease the size of the package of the computing and sensing chips and increase the applicability of the chip package. Furthermore, in the chip package described hereinbefore, there is no shelter on the sensing element (or image sensing element) of the sensing chip, or there is transparent substrate having a dam structure connected to the sensing chip so that a space is formed around the sensing element to protect the sensing element and simultaneously achieves the effect of light transmission. In the manufacturing method of the present disclosure, the protective layer which annularly surrounds the sensing chip and the computing chip is formed in a manner of laminating an epoxy resin tape, and followed by a heating treatment to form a strong protective layer. Since the laminating process is used, the formed protective layer is compact and no void presented therein, and that may further improve the leakage current and the protective effect during reliability tests. Accordingly, the present disclosure may form a chip package having both a computing chip and a sensing chip by using a novel and simplified process, and the manufactured chip package has a low leakage current and provides better protective effect to the chips during reliability tests.

Although particular embodiments have been shown and described, it should be understood that the above discussion is not intended to limit the present disclosure to these embodiments. Persons skilled in the art will understand that various changes and modifications may be made without departing from the scope of the present disclosure as literally and equivalently covered by the following claims.

What is claimed is:

1. A chip package, comprising:
    a sensing chip comprising a first conductive pad, a sensing element, a first surface and a second surface opposite to the first surface, wherein the sensing element is disposed on the first surface and electrically connected to the first conductive pad;
    a computing chip comprising a second conductive pad and a computing element;
    a protective layer annularly surrounding the sensing chip and the computing chip, and exposing the sensing element of the sensing chip;
    a conductive layer disposed on the second surface of the sensing chip, and extending to and in contact with the first conductive pad and the second conductive pad;
    a transparent substrate disposed on the first surface of the sensing chip and connected to the sensing chip and the computing chip, wherein the transparent substrate comprises a dam structure and the sensing chip is connected to the transparent substrate through the dam structure; and a flat plate structure disposed on the computing chip, wherein the computing chip is connected to the transparent substrate through the flat plate structure.

2. The chip package of claim 1, further comprising an insulation layer between the sensing chip and the conductive layer and between the computing chip and the conductive layer.

3. The chip package of claim 1, further comprising an external conductive connection on the conductive layer and electrically connected to the conductive layer.

4. A method for manufacturing chip packages, comprising:

providing a sensing chip comprising a first conductive pad, a sensing element, a first surface and a second surface opposite to the first surface, wherein the sensing element is disposed on the first surface and electrically connected to the first conductive pad;

providing a computing chip comprising a second conductive pad and a computing element;

connecting the first surface of the sensing chip to a transparent substrate, wherein the transparent substrate comprises a dam structure and the sensing chip is connected to the transparent substrate through the dam structure;

connecting the computing chip to the transparent substrate through a flat plate structure, wherein the flat plate structure is disposed on the computing chip;

laminating a protective layer on the second surface of the sensing chip, wherein the protective layer annularly surrounds the sensing chip and the computing chip;

removing a part of the protective layer to expose at least a part of the first surface, a part of the second surface or a combination thereof; and forming a conductive layer on the second surface of the sensing chip, the conductive layer extending to and in contact with the first conductive pad and the second conductive pad.

5. The method according to claim 4, wherein connecting the first surface of the chip to the transparent substrate comprises adhering the first surface of the chip to a dam structure positioned on the transparent substrate.

6. The method according to claim 4, further comprising forming an insulation layer between the chip and the conductive layer.

7. The method according to claim 4, further comprising forming an external conductive connection on the conductive layer and electrically connecting to the conductive layer.

* * * * *